United States Patent [19]
Lodi

[11] Patent Number: 6,142,435
[45] Date of Patent: Nov. 7, 2000

[54] INTEGRAL MOUNTING BASE SUPPORT FOR COMPONENTS

[75] Inventor: Frank Lodi, Niles, Ill.

[73] Assignee: Richco Inc., Chicago, Ill.

[21] Appl. No.: 09/336,515

[22] Filed: Jun. 18, 1999

[51] Int. Cl.[7] .................................................. A47B 96/06
[52] U.S. Cl. ............................. 248/222.41; 248/221.12; 403/316
[58] Field of Search ............. 248/221.12, 222.12, 248/222.41, 224.8, 225.11, 229.13, 229.23, 291.1, 298.1, 316.5; 403/315, 316

[56] References Cited

U.S. PATENT DOCUMENTS

| | | | |
|---|---|---|---|
| 693,127 | 2/1902 | Gardner et al. | 248/222.41 |
| 3,125,316 | 3/1964 | Wilmhoff | 248/221.22 |
| 3,176,944 | 4/1965 | Crates | 248/222.41 |
| 3,392,848 | 7/1968 | McConnell et al. | 248/221.12 |
| 4,405,108 | 9/1983 | Muirhead | 248/222.12 |
| 4,470,716 | 9/1984 | Welch | 248/221.12 |
| 5,420,762 | 5/1995 | Lewis | 248/222.41 |
| 5,791,502 | 8/1998 | Bietz et al. | 211/192 |
| 5,951,194 | 9/1999 | Faass et al. | 403/256 |
| 5,967,337 | 10/1999 | Fitzburgh | 248/222.12 |

*Primary Examiner*—Ramon O. Ramirez
*Assistant Examiner*—Walter Landry
*Attorney, Agent, or Firm*—Martin Faier; Faier & Faier P.C.

[57] ABSTRACT

A mounting support and a component integral with the support for secured mounting in a panel having a keyhole aperture, wherein the keyhole aperture has a smaller aperture intersecting with a larger aperture, and the support has a base for seating on the panel, a finger extending from the base which spans the keyhole aperture, a channel depending from the base which enters the keyhole aperture and slides from the larger aperture into the smaller aperture, a flange having a dimension no greater than the larger aperture but greater than the smaller aperture and which overlays the bottom of the panel, and an engaging member on the finger which releasably locks the support in the keyhole aperture and secures the component on the panel when the base is slid over the smaller aperture.

24 Claims, 2 Drawing Sheets

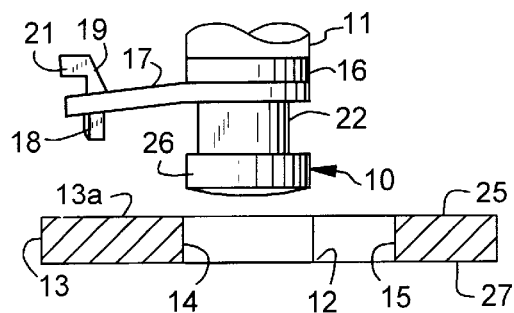
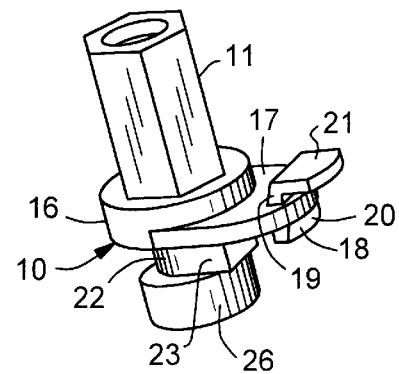
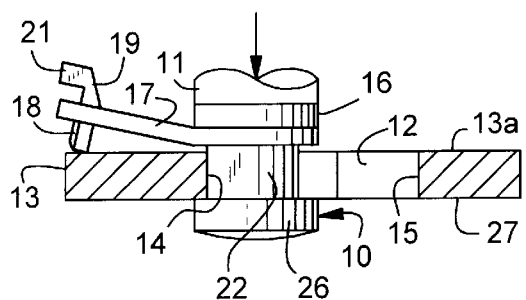
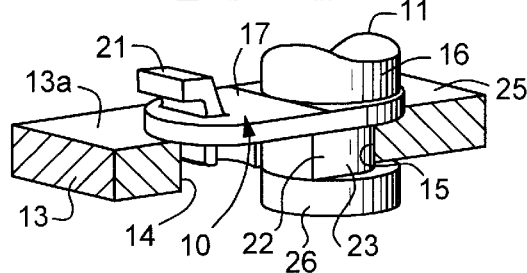
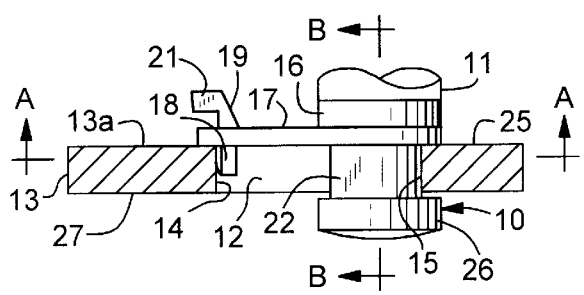
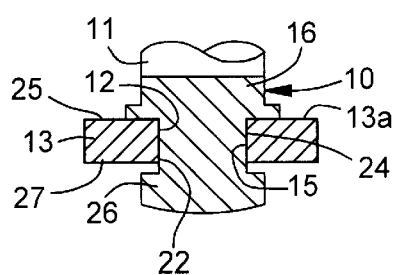
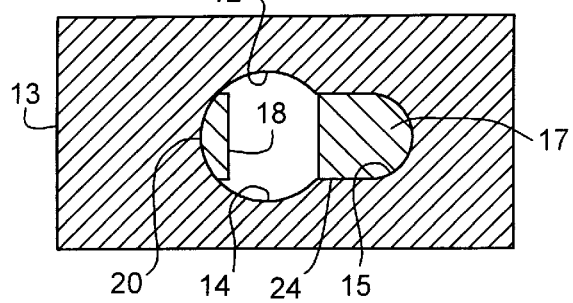

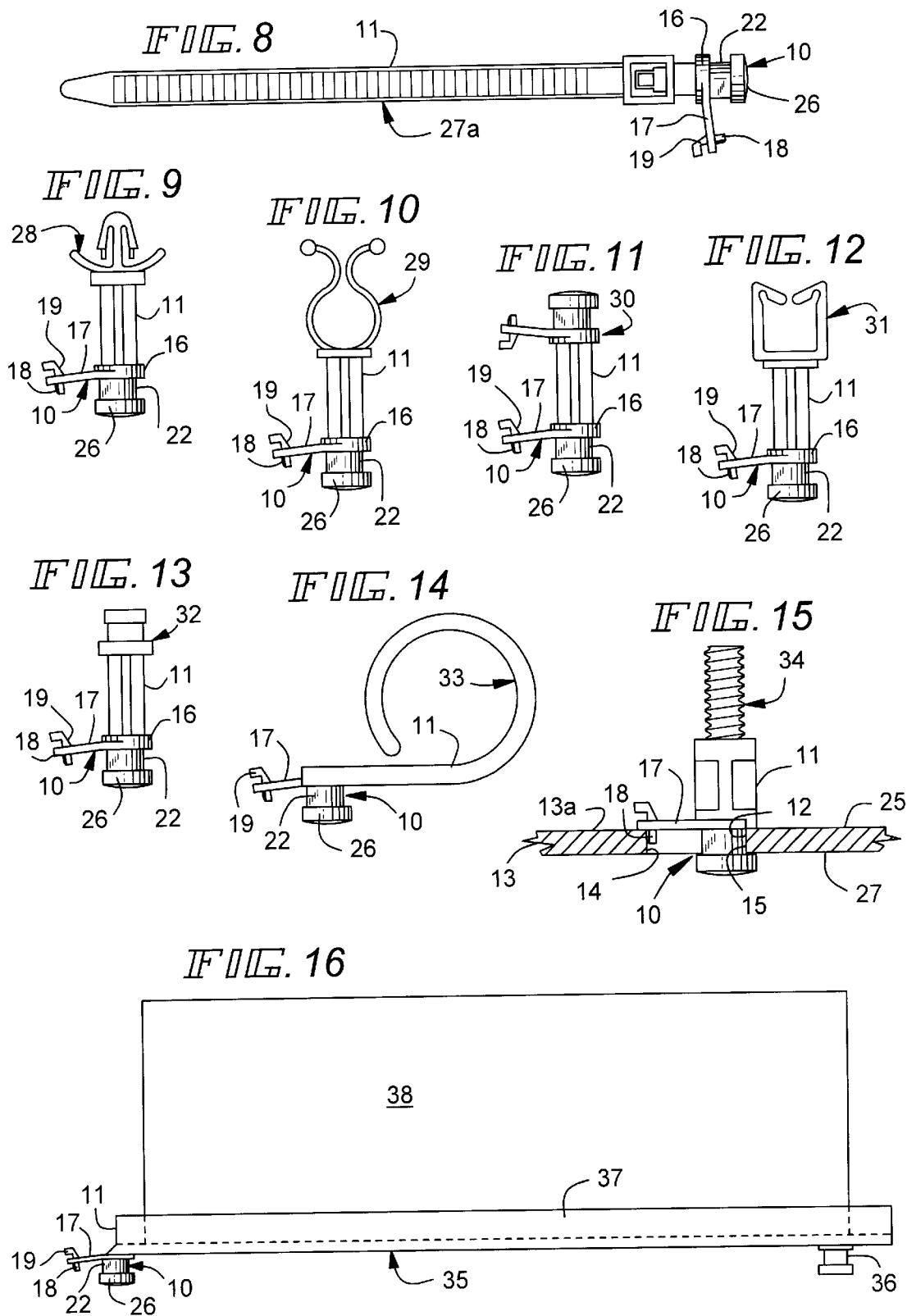

INTEGRAL MOUNTING BASE SUPPORT FOR COMPONENTS

BACKGROUND OF THE INVENTION

This invention relates to an integral mounting base support for electronic and other components, and is more particularly directed to such supports, which may be constructed of electrical insulating material, such as plastic, which can be fabricated in one piece with an associated electronic or similar component, such as a stand-off, circuit board support, clip, clamp, mounting rivet or screw or the like.

Such supports may be used for securing a circuit board or component on a chassis or for mounting a component or circuit board on another circuit board or frame or panel. These supports are often made of plastic or other electric insulating material to prevent unintended shorting or passage of electrical current from the component or circuit board to the media on which the component is mounted, except for intended electrical connection (in which case the support may be used to assure such connection). Such supports may also be fabricated in metal and used to secure a bolt, stud or the like. The mounting of the component must be rigid enough to inhibit or withstand shock or other movement affecting its mounting position. The mounting base should also be fabricated so it can be oriented in a horizontal, vertical or angular position.

Such a support must be easy to install and lock on an underlying surface. It is also desirable to provide simple means for releasing and withdrawing the supporting from the underlying surface, preferably from the top side of the underlying surface, in case the circuit board or component which requires servicing or repair or replacement, but during use the support must be securely locked in the desired selected position. With miniaturization prevalent in electronic devices, it is very desirable to make the support as shallow as possible, thus permitting the stacking of more components or boards within a given dimension and the support preferably protrudes as little as possible below the chassis or other underlying surface on which it is mounted.

Sometimes, the mounted component is so heavy or bulky as to require more than a single support to hold it. In such a case, conventionally, the spacing between the intended supports becomes critical. Where the support receiving means is an apertured panel or the like, the dimension between apertures and the kind of material used in fabricating the panel and support is also critical, because some materials have expansion or shrinkage characteristics which affect the mounting of the support, particularly where there is heat build-up which can affect the support during usage. The expansion or contraction characteristics of the support and receiving media make mounting of the support extremely difficult with conventional supports, because a slight change in the space between apertures in the underlying media can distort, loosen or dislodge the component.

A preferred support must be able to resist unintended rotation during use, particularly where the support is subjected to vibration or movement. An ideal support will require minimum insertion and extraction force for mounting in an apertured surface, without the use of special machines or tools. The underlying surface on which a support is mounted is of a given area, and miniaturization of electronic and similar devices requires that as large a number of supports as possible should be mounted within a given area, so it is worthwhile to provide a support which, while adequately holding the component, takes up as little space as possible on the underlying surface.

Some conventional supports cannot be suitably secured in a position other than horizontal, so that the component formed integrally with it must be oriented vertically on the underlying panel. Where the component is mounted other than vertically, shear forces can destroy the component or support, or when the panel is arranged other than horizontally, shock or other forces can cause the support to be pulled out of its mounting aperture, so that such structures may be of limited use because of this restricted orientation of the support on its underlying surface.

SUMMARY OF THE INVENTION

In the mounting support base embodying the present invention, the support is mounted in a keyhole slot surface formed in the underlying member, such as a panel or the chassis or a circuit board or frame. The support itself is formed with a finger or platform having a depending button-like flange spaced apart from the platform to define a groove, so that when the flange enters the larger aperture of the keyhole slot, the support is slid in the groove in the direction of the smaller aperture of the keyhole slot. The material on the sides of the smaller slot enters the button flange groove to hold the support captured and upright. The finger is flexible at its remote end in the direction of the smaller keyhole slot aperture, and this finger has a tooth and pawl which locks the support in position when the support is slid home against the smaller keyhole aperture; preferably, this tooth is tapered rearwardly-downwardly, away from the wall of the keyhole slot, thus permitting easier insertion of the finger into the slot and promoting locking of the tooth in the slot when the pawl is pressed toward the keyhole slot. The pawl may be lifted from the slot by mere upward fingernail pressure and a release projection, which frees the finger from the keyhole slot.

This spring finger is flexible at its end, permits the finger tooth to easily enter the end of the slot for locking it into position, and the support may be easily released from the top surface of the panel by merely manipulating the finger projection upwardly to release the lock, thus allowing the support to be slid away from the slot end until the button flange is aligned with the larger keyhole aperture, so that the support may be lifted from the apertured surface. Where spacing between mounting holes is critical, as discussed above, the installation of the part in the keyhole slot has sufficient flexibility to accommodate shrinkage or expansion of the support or the underlying surface without disturbing the mounting of the support or the component integrally associated with the support. Where a pair of spaced apart supports are used, one of the supports may be a conventional support, and only the support embodying the present invention is required to provide the intended necessary versatility. This mounting arrangement will permit continued securement of the support on the underlying surface, even when the environment in which the support exists heats up or excess or insufficient moisture would otherwise affect securement of the part on the underlying surface. The finger structure may include an upstanding handle projection for selectively manipulating the finger into lock release position.

Component structures of most known types may be co-molded integrally on the upper or a side surface of the platform and used in the manner described. These structures include a stand-off, circuit board support or guide, stud mounts, clip, clamp, wire tie or mounting rivet or screw or the like. A device embodying the present invention may be made just shallow enough to provide the platform-groove-button arrangement described, so that the overall space of the portion of the mounting base extending below the mounting surface is substantially less than conventional mounting bases, thus permitting increased stacking of components, such as circuit boards, within a given dimension.

The keyhole mounting arrangement allows the mounting base to resist rotation in the panel aperture, as the sides of the keyhole and the vertical walls of the groove are parallel, so that the mounting base may not be twisted when it has entered the keyhole. Such a mounting arrangement also permits the use of a greater number of mounting supports within a given surface area, because the support requires less space on the panel than conventional mounting supports. These supports have also been found superior to conventional mounting systems because they can be mounted in any orientation, even horizontally or depending from a board surface, without shear forces endangering the mounting. Such supports have also been found to have superior holding power as compared to known mounting systems.

OBJECTS AND ADVANTAGES OF THE INVENTION

It is the object of the invention to provide an integral mounting support for electronic and other components of the character described.

Another object is to provide such a support on a component which penetrates through and depends from an apertured underlying surface upon which it is to be mounted a lesser distance than conventional support systems, thus permitting increased stacking of components within a given dimension.

Another object is to provide such a support on a component intended for engagement on an apertured underlying panel which permits mounting of a larger number of components in a given area of an underlying surface than conventional supports.

Another object is to provide such a support on a component adapted for mounting in a keyhole aperture of an underlying surface oriented in a vertical, horizontal or angular position.

Another object is to provide such a support on a component which has a longitudinally grooved channel for holding the support upright in a keyhole slot in an underlying surface when the support is inserted in a larger aperture of the keyhole slot and slid toward the smaller aperture.

Another object is to provide such a support on a component which has a flexible locking finger on a platform adapted to enter a keyhole slot of an underlying surface and flexibly bear against a surface defining the slot.

Another object is to provide such a support on a component in which a flexible locking finger has a tooth and pawl device on the support for manipulating the finger from locked into release position for inserting and removal of the support from an apertured underlying panel.

Another object is to provide multiple supports including at least one support embodying the present invention for one or more components which can be mounted and locked in spaced apart apertures on an underlying surface to secure the component on the surface.

Another object is to provide such a support which has superior resistance to shear forces, resists unintended rotation and has superior holding power as compared to conventional supports.

Another object is to provide such a support which may plug its mounting aperture to inhibit passage of sound, liquid, fire, fines or the like.

Another object is to provide such supports integral with a component member which are simple, easy and economical to form and to install and remove from an underlying surface, and which are efficient in use.

These and other objects and advantages will become more apparent as this description proceeds, taken in conjunction with the accompany drawings.

BRIEF DESCRIPTION OF THE DRAWINGS

In the drawing:

FIG. 1 is a perspective view of a support embodying the present invention formed integrally with an illustrative tapping screw holding component.

FIG. 2 is a perspective view of the support portion of the device, with the component portion broken away, assembled in a panel or chassis, partially broken away, in section.

FIG. 3 is a view of the support as shown in FIG. 2 about to enter the keyhole slot of an underlying apertured surface, shown in section.

FIG. 4 is a view similar to FIG. 3, showing the support entered into the larger diameter portion of the keyhole slot of an underlying apertured surface.

FIG. 5 is a view similar to FIGS. 3 and 4, showing the support slid home in the smaller diameter portion of the keyhole slot of an underlying apertured surface.

FIG. 6 is a sectional view of the support and chassis taken on line A—A of FIG. 5.

FIG. 7 is a sectional view of the support and chassis taken on line B—B of FIG. 5.

FIGS. 8–16, respectively, are elevational views showing the novel support embodying the invention formed integrally with different components, namely, a wire tie (FIG. 8), a locking spacer support (FIG. 9), a twist lock wire bolder (FIG. 10), a dual key locking support (FIG. 11), a wire guide (FIG. 12), a spacer support (FIG. 13), a loop clamp (FIG. 14), a stud mount (FIG. 15), and a circuit board guide and holder (FIG. 16), respectively.

DESCRIPTION OF PREFERRED EMBODIMENTS

With reference to the accompanying drawings and particularly to FIGS. 1–7, the mounting base 10 is integrally formed at one end of a component 11, such as an internally threaded stud receiving member. The base 10 is intended to enter and releasably lock into a keyhole slot 12, formed in a panel 13 or other underlying surface, as shown in FIGS. 2–7. This keyhole slot 12 comprises a large aperture 14 intersecting with a co-planar small aperture. 15.

This mounting base 10 preferably comprises an upper shoulder 16 from which the component 11 extends in a direction away from the underlying surface 13. Extending substantially parallel to the shoulder 16 is a relatively thin platform or finger 17 of a length substantially corresponding to the length of the keyhole slot 12. This platform or finger 17 may have a dimension suitable for covering the keyhole slot, thus making it capable of inhibiting passage of fumes, liquid, fire, sound and the like through the panel 13, which may be of substantial importance in automotive and similar uses.

This finger 17 has depending from it at its free end opposite the shoulder 16 a depending tooth 18 and an upwardly extending pawl 19 arranged above the tooth 18. Preferably, the tooth 18 has a tapered wall 20 from the finger 16 in a downwardly-rearwardly direction to permit the tooth to more easily enter the keyhole slot 12 when the support is in engaging position, as hereafter described. This pawl 19 has on its extreme upper end a finger 21 which may be engaged with a person's fingernail to lift the finger 17 and tooth 18 for releasing the support 10 from the panel 13.

Arranged beneath the shoulder 16 and a portion of the finger 17 adjacent the shoulder is a channel wall 22 of a lesser dimension than the width of the shoulder 16. Opposed edges 23 of the channel wall 22 are parallel to provide flat surfaces adapted for engagement with like parallel opposed flat surfaces 24 of the small keyhole slot aperture 15 in the underlying panel or chassis 13. A button-like flange member 26 is arranged depending from and beneath the channel wall 22, and engages the underside 27 of the panel.

Extending above the shoulder 16 of the mounting base 10 and formed integrally with the mounting base 10 is the component 1, which is shown broken away in FIGS. 1–7. This component 11 may consist of a wire tie 27a (FIG. 8), or a locking spacer support 28 (FIG. 9), or a twist lock wire holder 29 (FIG. 10), or a dual key locking support 30 (FIG. 11), or a wire guide 31 (FIG. 12), or a spacer support 32 (FIG. 13), or a loop clamp 33 (FIG. 14), or a stud mount 34 (FIG. 15), or a circuit board guide and holder 35, which may have a mounting base 10 embodying the invention at one end and a conventional keyhole slot fastener 36 at its other end, with a circuit board holder 37 securing a circuit board 38 bridging the base and fastener (see FIG. 16). Many other kinds of components can be secured to or formed with the base support embodying the invention described herein.

In use, the support base 10 is arranged above the keyhole slot 12 formed in the underlying panel 13, such as a chassis or a circuit board or frame, as shown in FIG. 3. The support base 10 is pressed into the larger diameter aperture 14, as shown in FIG. 4, so that the flexible finger 17 and its associated members lay on the upper surface 13a of the underlying panel 13. This position shown in FIG. 4 aligns the opposed edges 23 of the channel wall 22 with the opposed flat edges 24 of the small keyhole aperture 15, permitting the support base 10 to slide from the large aperture 14 of the keyhole slot 12 in the track defined by the channel wall opposed edges 23 and the small aperture flat edges 24 into the small aperture 15 of the keyhole slot, whereupon the pawl 19 is pressed downwardly to lock the tooth 18 in the keyhole slot 12, thus capturing the support base 10 and securing the component 11 upright. The pawl 19 and panel 17 may be lifted from the slot 12 by mere upward fingernail pressure under the projection 21, which releases the support from the keyhole slot.

While a preferred embodiment of the invention has been shown and described in substantial detail, many modifications can be made in the structure without departing from the spirit or scope of the invention. Accordingly, it is not desired that the invention should be limited, except to the extent as claimed in the following claims.

What is claim is:

1. A mounting support and a component integral with said support extending upright on one side thereof, said support adapted for secured mounting in a panel having a keyhole aperture, said keyhole aperture comprising a smaller aperture intersecting with a larger aperture, said support comprising a base arranged on a side thereof remote from said component, said base adapted for seating on one surface of said panel, a finger extending from said base adapted to span said aperture substantially in the plane of said one panel surface, a channel member depending from said base adapted for entry into said aperture, said channel member having a cross section adapted to be no greater than said smaller aperture and adapted to slide from said larger aperture into said smaller aperture, a flange having a dimension adapted to be no greater than said larger aperture but greater than said smaller aperture adapted to overlay a surface of said panel opposed to said one panel surface, and engaging means on said finger adapted for locking said support in said keyhole aperture and securing said component on said panel when said channel member and flange are inserted into said larger panel aperture and said base is slid over said smaller aperture.

2. In the mounting support and component recited in claim 1, wherein said keyhole slot has opposed parallel sides spaced apart a distance no greater than said smaller aperture and said channel member has a track substantially corresponding to said sides adapted to slideably engage in said sides and to resist twisting of said support in said aperture when mounted.

3. In the mounting support and component recited in claim 1, wherein said support has a shoulder to which said component is integrally joined.

4. In the mounting support and component recited in claim 1, wherein said finger is flexible and adapted for bending movement toward and away from said panel.

5. In the mounting support and component recited in claim 4, wherein said engaging means is formed on an end of said finger remote from said support.

6. In the mounting support and component recited in claim 4, wherein said engaging means has a tooth extending from said finger adapted for securement in said larger diameter aperture.

7. In the mounting support and component recited in claim 6, wherein said engaging means tooth is tapered in a direction away from said aperture and said one panel surface.

8. In the mounting support and component recited in claim 6, wherein a wall of said engaging means tooth is formed to conform to the wall of said small diameter aperture.

9. In the mounting support and component recited in claim 4, wherein said engaging means has a pawl for moving the flexible end of said finger toward and away from said panel aperture.

10. In the mounting support and component recited in claim 9, wherein said pawl has a projection adapted for fingernail engagement lift said engaging means from said aperture to release said support from said panel.

11. In the mounting support and component recited in claim 1, wherein the distance between said base and said flange is adapted to be substantially similar to but slightly greater than the thickness of said panel.

12. In the mounting support and component recited in claim 1, wherein said channel member has a side adapted to engage a side of said small diameter aperture.

13. In the mounting support and component recited in claim 1, wherein said component comprises a wire tie integral with and formed on said base.

14. In the mounting support and component recited in claim 1, wherein said component comprises a locking spacer support integral with and formed on said base.

15. In the mounting support and component recited in claim 1, wherein said component comprises a twist lock wire holder integral with and formed on said base.

16. In the mounting support and component recited in claim 1, wherein said component comprises a dual key locking support integral with and formed on said base.

17. In the mounting support and component recited in claim 1, wherein said component comprises a locking spacer support integral with and formed on said base.

18. In the mounting support and component recited in claim 1, wherein said component comprises a wire guide integral with and formed on said base.

19. In the mounting support and component recited in claim 1, wherein said component comprises a spacer support integral with and formed on said base.

20. In the mounting support and component recited in claim 1, wherein said component comprises a loop clamp integral with and formed on said base.

21. In the mounting support and component recited in claim 1, wherein said component comprises a stud mount integral with and formed on said base.

22. In the mounting support and component recited in claim 1, wherein said component comprises a circuit board guide and holder integral with and formed on said base.

23. In the mounting support and component recited in claim 22, wherein said support engages said panel at one end of said guide and a fastener is spaced apart from said support and engages said guide at an end remote from said one end.

24. In the mounting support and component recited in claim 1, wherein said support covers said keyhole aperture when said support is adapted to be installed on a panel.

* * * * *